United States Patent
Moronval et al.

(10) Patent No.: US 9,577,585 B2
(45) Date of Patent: Feb. 21, 2017

(54) ULTRA WIDEBAND DOHERTY AMPLIFIER

(71) Applicant: NXP B.V., Eindhoven (NL)

(72) Inventors: Xavier Moronval, Colomiers (FR); Jean-Jacques Bouny, Colomiers (FR); Gerard Bouisse, Colomiers (FR)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 14/667,787

(22) Filed: Mar. 25, 2015

(65) Prior Publication Data
US 2015/0295542 A1 Oct. 15, 2015

(30) Foreign Application Priority Data

Apr. 15, 2014 (EP) .................................. 14290110

(51) Int. Cl.
*H03F 1/02* (2006.01)
*H03F 3/19* (2006.01)
*H04W 88/08* (2009.01)

(52) U.S. Cl.
CPC ............. *H03F 1/0288* (2013.01); *H03F 3/19* (2013.01); *H04W 88/08* (2013.01); *H03F 2200/301* (2013.01); *H03F 2200/36* (2013.01); *H03F 2200/451* (2013.01)

(58) Field of Classification Search
CPC ......... H03F 1/0288; H03F 1/07; H03F 1/3252
USPC .............................................. 330/295, 124 R
See application file for complete search history.

(56) References Cited

U.S. PATENT DOCUMENTS

| 7,800,448 B2 * | 9/2010 | Blednov | ............... H03F 1/0288 330/124 R |
| 9,190,965 B2 * | 11/2015 | Ladhani | ................ H03F 1/0288 |
| 2004/0189380 A1 | 9/2004 | Myer et al. | |
| 2008/0074735 A1 | 3/2008 | Bakalski et al. | |

(Continued)

FOREIGN PATENT DOCUMENTS

| EP | 1 793 490 A1 | 6/2007 |
| WO | WO-2005/043747 A2 | 5/2005 |

OTHER PUBLICATIONS

Caulton, Martin et al; "Status of Lumped Elements in Microwave Integrated Circuits—Present and Future"; IEEE Transactions on Microwave Theory and Techniques; pp. 558-594 (Jul. 1, 1971).

(Continued)

*Primary Examiner* — Henry Choe
(74) *Attorney, Agent, or Firm* — McDonnell Boehnen Hulbert & Berghoff LLP

(57) ABSTRACT

A Doherty amplifier for amplifying an input signal to an output signal, the Doherty amplifier comprising: a main amplifier for receiving a first signal and for amplifying the first signal to generate a first amplified signal; a first peak amplifier for receiving a second signal and for generating a second amplified signal, the first peak amplifier only operating when the second signal has reached a first threshold power, the first and second signal split from the input signal; and output circuitry to combine the first and second amplified signals to generate an output signal having an operating bandwidth, the output circuitry comprising inductors arranged in the format of a branch line coupler, the inductors coupled to the output parasitic capacitances of the main and peak amplifier.

12 Claims, 5 Drawing Sheets

(56) References Cited

U.S. PATENT DOCUMENTS

2008/0224771 A1* 9/2008 Bouny .................... H01L 23/66
330/66
2010/0026387 A1 2/2010 Blednov

OTHER PUBLICATIONS

Extended European Search Report for Application No. 14175618.9 (Sep. 23, 2015).
Giofre, Rocco et al; "A Doherty Architecture With High Feasibility and Defined Bandwidth Behavior"; IEEE Transactions on Microwave Theory and Techniques, vol. 61, No. 9; pp. 3308-3317 (Sep. 2013).
Tongchoi, C. et al; "Lumped Element Based Doherty Power Amplifier Topology in CMOS Process"; Proceedings of the 2003 IEEE International Symposium on Circuits and Systems, vol. 1; pp. 445-448 (May 25, 2003).
Giofre, Roco, et al; "New Output Combiner for Doherty Amplifiers"; IEEE Microwave and Wireless Components Letters, vol. 23, No. 1; (3 pages) (Jan. 2013).

\* cited by examiner

ULTRA WIDEBAND DOHERTY AMPLIFIER

CROSS-REFERENCE TO RELATED APPLICATIONS

This application claims the priority under 35 U.S.C. §119 of European patent application no. 14290110.7, filed on Apr. 15, 2014, the contents of which are incorporated by reference herein.

The present invention relates to a Doherty amplifier, in particular but not exclusively, the present invention relates to a Doherty amplifier that is capable of amplifying a signal over a wide operating bandwidth.

Modulated radio-frequency (RF) signals are used in a wide variety of communications systems such as mobile phones, cellular base stations for mobile phones and satellite communications. Once received, RF signals are amplified before being processed.

Conventional amplifiers have a generally linear relationship between input power and efficiency, and between input power and output power, during normal operation. As input power increases, efficiency and output power both increase. This means that high input power is required before high efficiency can be achieved. Eventually, the amplifier is driven into saturation where the relationship between input power and output power is non-linear. In saturation, the output power does not increase as much. It is inefficient to operate an amplifier past saturation.

In systems using multi-band RF signals, driving an amplifier in the non-linear region also increases distortion on the signal. This means conventional amplifiers cannot be used in the high-efficiency region. To overcome this, Doherty topology amplifiers are used.

A Doherty amplifier has a main amplifier and a peak amplifier. The main amplifier is a class AB amplifier that is operated at a point close to saturation. The peak amplifier is a class C amplifier that is only operated when the main amplifier is saturated.

In use, an input signal is split and provided to the peak and main amplifier. The outputs of the two amplifiers are combined to give an amplified output signal. At low input power, only the main amplifier is operational. At high input power, the peak amplifier is also operational. By using this arrangement, high efficiency and linear performance can be achieved.

RF signals in communications systems often have a high ratio of average power to peak power (sometimes 8 dB or higher). To ensure that the Doherty amplifier is operated in the linear region across the whole power range of the input, so that the amplifier is efficient and has reduced signal distortion, the Doherty amplifier is operated with the input power reduced from the maximum possible. This is known as operating the amplifier in back-off mode.

The circuitry required to split the input signal and combine the output signal requires substantial filtering of the signals. This means that a Doherty amplifier is typically operational over a narrow bandwidth. For example, in a cellular base station having allocated bands ranging from 0.7 GHz to 2.7 GHz, a Doherty amplifier may only have a relative bandwidth of the order of 5%, and thus each amplifier will only be able to operate over a single band. Therefore, to cover the whole bandwidth, a large number of different amplifiers have to be implemented which is costly in time and resources and inefficient in power consumption.

At least one object of the invention is to provide a wideband Doherty amplifier that can be used in multiband RF communication systems.

According to a first aspect, there is provided a Doherty amplifier as claimed in claim 1.

The output circuitry means the outputs of the main and peak amplifiers can be combined at lower impedance, eliminating the need for filtering of the signals and thus increasing the operational bandwidth of the amplifier.

Optionally, the output circuitry may be a first inductor having first inductance connected on the output line of the first peak amplifier; a second inductor having first inductance connected on the output line of the main amplifier; a third inductor having second inductance branching between the outputs of the first inductor and second inductor; a fourth inductor having second inductance branching between the inputs of the first and second inductors; and an output load between the second and third inductors.

The Doherty amplifier optionally comprises a grounded capacitor connected on the output line of the main amplifier. The grounded capacitor may be connected on the junction of the second and third inductors.

A grounded capacitor may also be connected on the output line of the first peak amplifier. The grounded capacitor may be connected on the junction of the first inductor and the third inductor.

The Doherty amplifier may have a relative operating bandwidth of at least about 50% and may be arranged to operate at a back-off of at least about 3 dB.

Optionally, the Doherty amplifier may comprise back-off circuitry arranged to increase the operating back off at which the peak efficiency of the amplifier occurs. This allows the Doherty amplifier to operate over a wide ratio of average input power to peak input power whilst still behaving in a linear way, reducing distortion introduced by non-linear behaviour.

The back-off circuitry may include a second peak amplifier, for receiving a third signal split from the input signal and for generating a third amplified signal, the second peak amplifier only operating when the third signal has reached a second threshold power, the output parasitic capacitance of the second peak amplifier being coupled to the output circuitry, the output circuitry being arranged to combine the first, second and third amplified signals to generate the output signal.

The first threshold may be the same as the second threshold or may be different. This allows for tuning of the efficiency and linearity characteristics of the amplifier.

Where the back-off circuitry includes a second peak amplifier, the power of each peak amplifier may be n times that of the main amplifier, such that the ratio of the main amplifier to the Doherty amplifier is 1:2n+1 n may be 3, in which case the peak efficiency of the amplifier may occur at a back-off of between 8 dB and 9 dB.

This provides an optimally efficient Doherty amplifier for some applications such as cellular base stations. The skilled will appreciate that other applications may require operate at different back-off. Where the back-off circuitry includes a second peak amplifier, the Doherty amplifier may have a relative operating bandwidth of approximately 60%. In addition or alternatively, the Doherty amplifier may have a power capability of between a few Watts and a few hundred Watts.

The relative operating bandwidth of an amplifier is given by the following equation:

$$\frac{2(f_2 - f_1)}{(f_2 + f_1)} \times 100$$

where $f_2$ is the upper bound of the operating bandwidth and $f_1$ is the lower bound of the operating bandwidth.

In one example, $f_2$ may be 2.9 GHz and $f_1$ may be 1.6 GHz.

In one example, the power capability of the Doherty amplifier may be between 25 W and 125 W.

This makes the Doherty amplifier suitable for applications such as cellular base stations as it can operate over a number of bands, and at sufficient back-off to allow for high ratio average to peak power signals.

The Doherty amplifier may include input circuitry that may be arranged to receive the input signal and split it into the first signal and second signal. The input circuitry may alternatively split the input signal into a first signal, a second signal and third signal.

The main and peak amplifiers may comprise field effect transistors. Optionally, the input circuitry may comprise input inductors arranged in the format of a branch line coupler, the input inductors being coupled to the gate parasitic capacitances of the main amplifier and the first peak amplifier.

This improves the impedance matching between the input circuitry and output circuitry, ensuring the signals from the main and peak amplifier are in phase when combined.

Where the main and peak amplifiers comprise field effect transistors, the Doherty amplifier may include a first capacitor connected across the source and drain of the main amplifier; a second capacitor connected across the source and drain of the first peak amplifier; a third capacitor connected across the gate and source of the main amplifier; and a fourth capacitor connected across the gate and source of the first peak amplifier, the first and second capacitors arranged to couple the output parasitic capacitances to the output circuitry, and third and fourth capacitors arranged to couple the gate parasitic capacitances to the input circuitry.

This provides an efficient way of coupling the parasitic capacitances to the input and output circuitry.

The input circuitry may comprise a first input inductor having first input inductance connected on the input line of the main amplifier; a second input inductor having first input inductance connected on the input line of the peak amplifier; a third input inductor having second inductance branching between the inputs of the first and second input inductors; a fourth input inductor having second inductance branching between the outputs of the first and second input inductors; and an input for the input signal between the second and fourth input inductors.

The output circuitry may comprise four artificial transmission lines that act as ninety degree transmission lines. The first artificial line may comprise the first capacitor, the fourth inductor and the second capacitor. The second artificial line may comprise the first capacitor, the second inductor and the grounded capacitor on the main amplifier output line. The third artificial line may comprise the second capacitor, the first inductor and the grounded capacitor on the peak amplifier output line. The fourth artificial line may comprise the grounded capacitor on the main amplifier output line, the third inductor and the grounded capacitor on the peak amplifier output line.

Such an arrangement mimics a branch line coupler comprising 90 degree transmission lines, but reduces the filtering effects of the branch line coupler, leading to a wider operation range.

The gate voltage of the main amplifier may be provided between the first input inductor and the fourth input inductor and the gate voltage of the first peak amplifier may be provided at the input for the input signal. Where the Doherty amplifier includes a second peak amplifier, the second peak amplifier comprising a field effect transistor, the gate voltage for the second peak amplifier may be provided between the second and third inductors.

Where the Doherty amplifier includes a second peak amplifier, the second peak amplifier may comprise a field effect transistor and the input circuitry may be coupled to the gate parasitic capacitance of the second peak transistor and the second peak transistor may be connected between the second and third input inductors.

Where the Doherty amplifier includes a second peak amplifier, the second peak amplifier comprising a field effect transistor, the Doherty amplifier optionally includes a fifth capacitor connected across the gate and source of the second peak amplifier, for coupling the gate parasitic capacitance of the second peak amplifier to the input circuitry, and the grounded capacitor may be coupled across the source and drain of the second peak amplifier, for coupling the output parasitic capacitance of the second peak amplifier to the output circuitry.

Where the Doherty amplifier includes a second peak amplifier, the second peak amplifier comprising a field effect transistor, the first threshold may be controlled by the gate voltage of the first peak amplifier and the second threshold may be controlled by the gate voltage on the second peak amplifier.

Such an amplifier may be useful in mobile phones and applications such as satellite communications.

According to a second aspect, there is provided a cellular base station having a bandwidth between 0.7 GHz and 2.7 GHz, the cellular base station comprising: a Doherty amplifier according to the first aspect, when comprising a second peak amplifier, the Doherty amplifier operating across at least five channels of the base station.

According to a third aspect, there is provided an amplifier arrangement comprising a plurality of Doherty amplifiers according to the first aspect, wherein the Doherty amplifiers are connected in parallel to one another.

This allows for the power of the amplifier arrangement to be Increased.

According to a fourth aspect, there is provided an integrated chip comprising a Doherty amplifier according to the first aspect or an amplifier arrangement according to the third aspect.

The chip may be formed on Gallium Nitride. Alternatively, the chip may be formed on a high resistivity substrate LDMOS or Gallium Arsenide material system.

This allows the Doherty amplifier to be implemented using integrated inductors instead of bond wires, making it easily realizable on a compact chip.

The amplifier may have an operating range of 0.8 GHz to 3.5 GHz.

BRIEF DESCRIPTION OF THE DRAWINGS

The invention is described in further detail in the following by way of exemplary embodiments and with reference to the accompanying drawings, in which.

DETAILED DESCRIPTION

Figure 1:
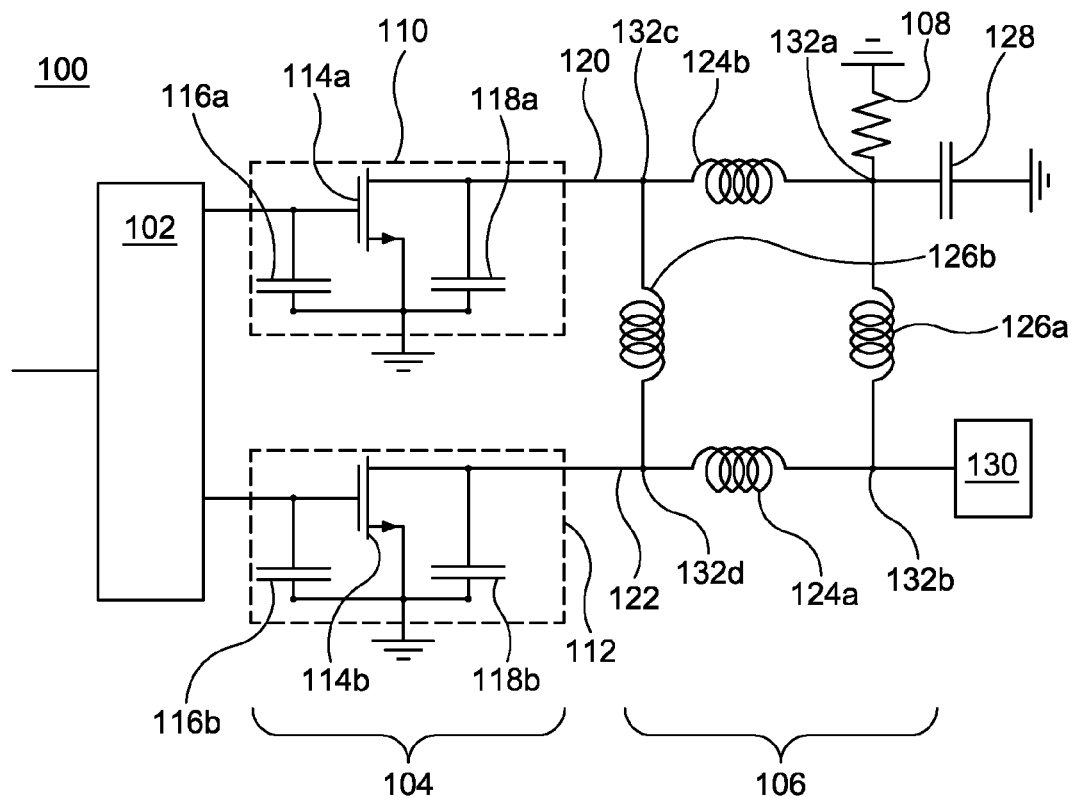
FIG. 1 is a schematic drawing of an ultra wideband Doherty amplifier.

FIG. 1 is a schematic diagram of a circuit for a Doherty amplifier 100 according to some embodiments. The Doherty amplifier 100 includes input circuitry 102, an amplifier stage 104, and output circuitry 106.

The input circuitry 102 receives an input RF signal and splits it into split signals which are provided to the amplifier stage 104. The split signals are out of phase from each other and reduced in power from the input signal. The input signal is split into at least a first signal and a second signal. In some examples, a third signal may be split from the input signal.

The amplifier stage 104 amplifies the split signals and provides amplified signals to the output circuitry 106.

The output circuitry 106 combines the amplified signals to form an amplified output signal, which is provided to an output load 108. The input circuitry 102 and the output circuitry 106 are operated to ensure that the first amplified signal and the second amplified signal are in phase at the point at which they are combined.

The input circuitry 102, amplifier stage 104, and output circuitry 106 are discussed in more detail below.

The amplifier stage 104 includes a main amplifier 110 and a first peak amplifier 112. As discussed above, the main amplifier 110 is a class AB amplifier operated at, or close to, saturation. The first peak amplifier 112 is a class C amplifier that is operated once the input power has exceeded a first threshold.

The first threshold is controlled by the gate voltage applied to the gate of the first peak amplifier 112.

The main amplifier 110 includes a main field effect transistor (FET) 114a. A voltage input at the gate is amplified and extracted at the drain. The main FET 114a is biased to operate as a class AB amplifier.

A main input capacitor 116a connected across the source and gate of the main FET 114a, and a main output capacitor 118a connected across the source and drain of the main FET 114a. The main input capacitor 116a represents the parasitic capacitance arising from the capacitor formed by the conducting plate forming the gate and the conducting plate forming the source. Similarly, the main output capacitor 118a extracts capacitance arising from the capacitor formed by the conducting plate forming the source and the conducting plate forming the drain.

Similarly to the main amplifier 110, first peak amplifier 112 includes a first peak amplifier FET 114b. A first peak amplifier input capacitor 116b is connected across the source and gate of the first peak amplifier FET 114b and a first peak amplifier output capacitor 118b is connected across the source and drain of the first peak amplifier FET 114b. The first peak input and output capacitors 116b, 118b extract the parasitic capacitances in a similar manner to the mean input and output capacitors 116a, 118a. The first peak amplifier 112 is similar in design to the main amplifier 110. However, the first peak amplifier 112 is biased to operate as a class C amplifier rather than a class AB amplifier.

The output circuitry 106 is connected to the output line 120 of the main amplifier 110 and the output line 122 of the first peak amplifier 112. The output circuitry includes a first inductor 124a on the output line of the first peak amplifier and a second inductor 124b connected on the output line of the main inductor. In this embodiment, the first and second inductors 124 have the same inductance. However, in other embodiments, they may be different.

A third inductor 126a and a fourth inductor 126b branch between the output line 120 of the main amplifier 110 and the output line 122 of the first peak amplifier 112.

The third inductor 126a branches from the output line 120 of the main amplifier at a first branch point 132a, located at the output of the second inductor 124b, and branches from the output line 122 of the first peak amplifier 112 at a second branch point 132b, located at the output of the first inductor 124a.

The fourth inductor 126b branches from the output line 120 of the main amplifier at a third branch point 132c, located between the main amplifier FET 114a and the second inductor 124b, and branches from the output line 122 of the first peak amplifier 112 at a fourth branch point 132d, located between the first peak amplifier FET 114b and the first inductor 124a.

In this embodiment, the third and fourth inductors 126 have the same inductance, different from the inductance of the first and second inductors 124. However, in other embodiments, the inductance of the third and fourth inductors 126 may be different. For example the inductance of the third and fourth inductors 126 may be approximately four times the inductance of the first and second 124 The output load 108 is connected to the first branch point 132a.

Figure 2A:
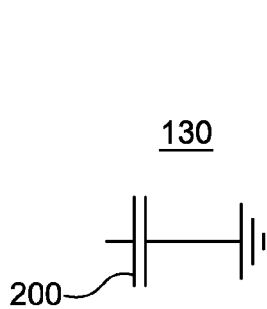
FIG. 2A is a schematic drawing of one example of a line termination component.
Figure 2B:
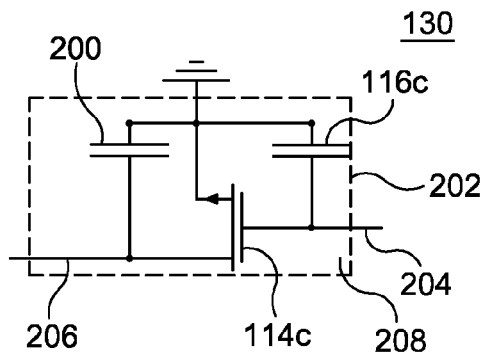
FIG. 2B is a schematic drawing of another example of a line termination component.

A first grounded capacitor 128 is connected at branching point 132a, after the second 124b and third 126a inductors. There are a number of alternative arrangements for connection at branch point 132b, after the first 124a and second 126a inductors, shown by block 130. Two examples of the circuitry that can be connected at block 130 are shown in FIGS. 2A and 2B. In both cases, this includes a second grounded capacitor 200.

The output circuitry 106 behaves as a branch line coupler. A branch line coupler is formed of four 90 degree transmission lines arranged to combine or spilt input signals. The transmission lines are high impedance components that reduce the bandwidth of signals that can be used. The output circuitry 106 uses capacitors 118a, 118b, 128, 200 and inductors 124, 126 to create artificial transmission lines have the same effect of the transmission lines but are lower impedance so an output signal with greater bandwidth can be achieved.

In this instance, the four transmission lines of a branch line coupler are replaced by the following artificial lines:

The output capacitor 118a of the main amplifier 110, the fourth inductor 126b, and the output capacitor 118b of the first peak amplifier 112.

The output capacitor 118a of the main amplifier 110, the second inductor 124b, and the first grounded capacitor 128.

The output capacitor 1181) of the first peak amplifier 112, the first inductor 124a, and the second grounded capacitor 200.

The first grounded capacitor 128, the third inductor 126a and the second grounded capacitor 200.

In one example, shown in FIG. 2A, the block 130 comprises only the second grounded capacitor 200 and only a first signal and a second signal, split from the input signal, are provided to the amplifier stage 104.

By way of example only, the following values may be used:
first and second inductors 124: 0.6 nH
third and fourth inductors 126: 2.3 nH
main input capacitor 116a: 24 pF
first peak input capacitor 116b: 24 pF
main output capacitor 118a: 7 pF
first peak output capacitor 118b: 7 pF
output capacitor 128: 7 pF.

Figure 3A:
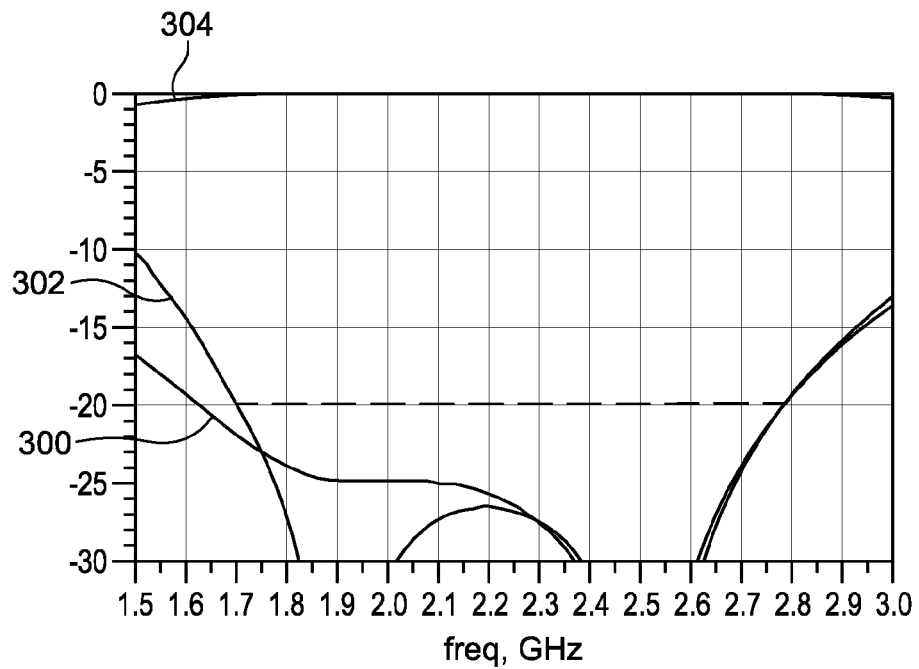
FIG. 3A shows the return and transmission losses for a Doherty amplifier including the line termination component of FIG. 2A.

FIG. 3 shows the return loss at full power (in dB) 300, the return loss at low power (in dB) 302, and the transmission loss at low power (in dB) 304. These results are simulated for when the block 130 is as shown in FIG. 2A and when the above variables are taken. In one example, the operational bandwidth is the bandwidth at which there is lower than −20 dB return loss across both the low power and high power cases. It can therefore be seen that in the above example, where the block 130 comprises only the grounded capacitor 200, as shown in FIG. 2A, the operational bandwidth of the Doherty amplifier is 110 GHz to 2.78 GHz. This represents a relative bandwidth of approximately 50%.

By varying the values of the inductances and capacitances, the upper and lower bounds of the operational bandwidth will change. However, the relative bandwidth of the Doherty amplifier 100 will remain approximately 50%.

Figure 3B:
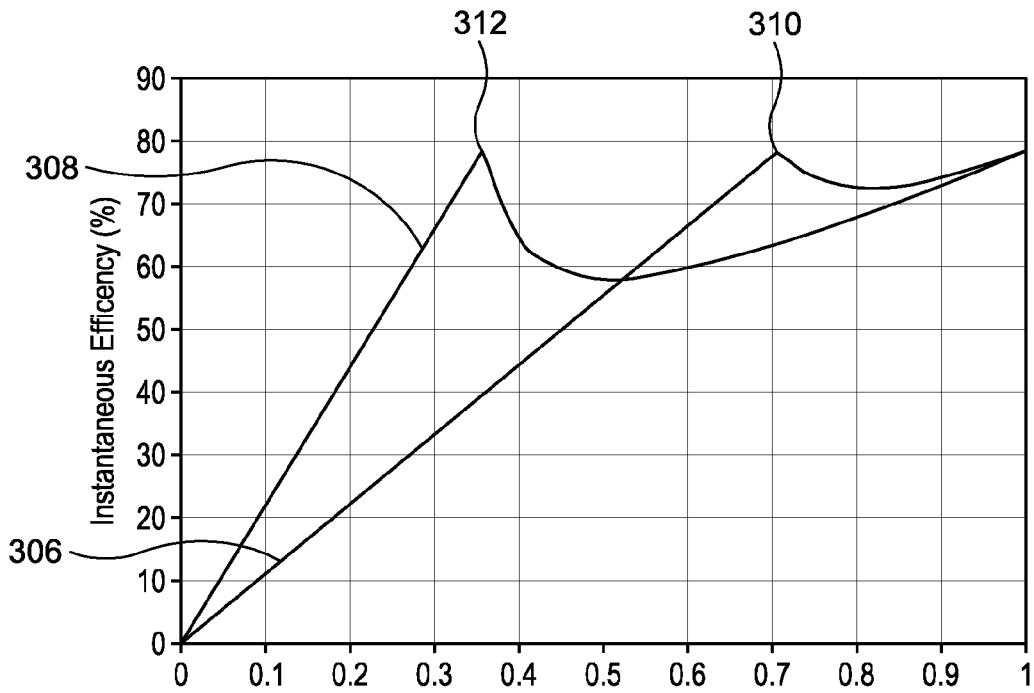
FIG. 3B shows the efficiency for a Doherty amplifier.

FIG. 3B shows the variation of the efficiency of the above example as a function of normalised output voltage in plot 306. The peak efficiency occurs at the point 310. This corresponds to operating at 3 dB back off.

In an example application, Doherty amplifiers 100 are used in mobile phones. The average to peak power ratio of signals received in this application is lower than in a base station and so operation at only 3 to 3.5 dB back-off is required. Therefore, a Doherty where the block 130 only includes the second grounded capacitor 200 would be useful in this application.

Significantly larger back-off cannot be achieved in this example because of the lack of modulation of impedance in the output of the main amplifier. Typically back-off can be increased by providing increased impedance modulation. Alternatively, back-off can be increased by increasing the ratio of the power of the main amplifier 110 to the overall power Doherty amplifier 100.

One example way to achieve an increase in the ratio of the power of the main amplifier 110 to the overall power Doherty amplifier 100, is to use block 130 shown in FIG. 2B. In this example, the block 130 may comprise back-off circuitry 208. The back-off circuitry 208 provides a second peak amplifier 202 that is arranged in a similar fashion to the first peak amplifier 112. Back-off circuitry 208 includes a second peak amplifier FET 114c, with an input capacitor 116c connector across the source and gate. The second grounded capacitor 200 is connected across the source and drain of the second peak amplifier FET 114c to couple the output parasitic capacitance.

In this case, the input signal is split into a first signal, a second signal and a third signal. The first signal and second signal are provided to the main amplifier 110 and peak amplifier 112 respectively, as discussed previously. The third signal is provided at the input 204 of the second peak amplifier whilst the output 206 of the second peak amplifier 202 is connected to the output circuitry at the second branch point 132b.

The second peak amplifier 202 is only operational once the input power has reached a second threshold. The second threshold can be controlled by varying the gate voltage applied to the second peak amplifier 202. Below the second threshold, the block 130 shown in FIG. 26 will simply function in the same way as the grounded capacitor as shown in FIG. 2A. This is because the second peak amplifier FET 114c is not hi operation, so capacitor 200 functions as a grounded capacitor.

The second threshold, at which the second peak amplifier 202 becomes operational can be the same as the first threshold, at which the first peak amplifier 112 becomes operation. Alternatively, to vary the linearity and/or efficiency of the overall Doherty amplifier 100, the thresholds can be different.

In one example, the first peak amplifier 112 and the second peak amplifier 202 have the same power, which is larger than the power of the main amplifier 110 by a factor of n. This 1:n:n arrangement provides an overall ratio of the power of the main amplifier 110 to the power of the Doherty amplifier 100 of 1:2n+1. In one example, n=3 so the overall ratio of the power of the main amplifier 110 to the Doherty amplifier 100 of 1:7.

It will be appreciated that the first peak amplifier 110 and the second peak amplifier 202 may have different powers, and any suitable value of n may be used.

Figure 4:
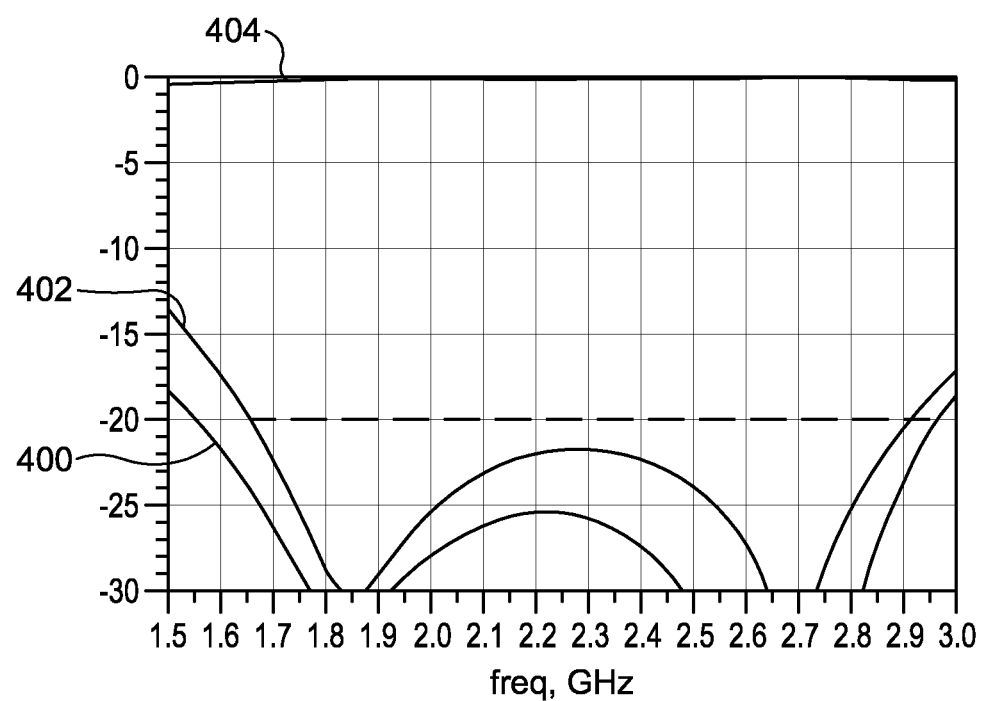
FIG. 4 shows the return and transmission losses for a Doherty amplifier including the line termination component of FIG. 2B.

Using n=3, 0.2 nH for first inductor 124a, 72 pF for first peak amplifier input capacitor 116b and second peak amplifier input capacitor 116c, 21 pF for first peak amplifier output capacitor 118b and the second grounded capacitor 200, and otherwise the same capacitances and inductances disclosed above, leads to the simulated results shown in FIG. 4.

FIG. 4 shows the return loss at full power (in dB) 400, the return loss at low power (in dB) 402, and the transmission loss at lower power (in dB) 404, when the block 130 comprises a second peak amplifier 202. Again defining the operational bandwidth as the bandwidth at which there is lower than −20 dB return loss across both the low power and high power cases, the operational bandwidth of the Doherty amplifier is 1.66 GHz to 2.91 GHz, or 55% relative bandwidth As with the previous example, by varying the values of the inductances and capacitances, the upper and lower bounds of the operational bandwidth will change. However, the relative bandwidth of the Doherty amplifier 100 will remain approximately 55%.

This technique is appropriate for applications whose operating frequency is comprised approximately in between 0.5 GHz to 10 GHz.

FIG. 3B shows the efficiency of this example as curve 308. This is shown on FIG. 3B for comparison with the efficiency of curve 306. The peak efficiency 312 has shifted to a lower normalised output voltage, showing a decrease in back-off to 8.9 dB.

In one example, Doherty amplifiers 100 are used in cellular base stations for mobile communications. Base stations operate over a range of 0.7 GHz to 2.7 GHz and are required between 8 db and 9 db back-off to allow for signals with high average to peak ratios. Therefore, a Doherty amplifier where the block 130 includes a second peak amplifier 208, as shown in FIG. 2B, would be suitable for use in a cellular base station. The relative bandwidth of 55% is sufficient to cover five separate bands at once (e.g. 1.805-1.88 GHz, 1.93-1.99 GHz, 2.11-2.17 Hz, 2.3-2.4 GHz, and 2.5-2.7 GHz).

Figure 5:
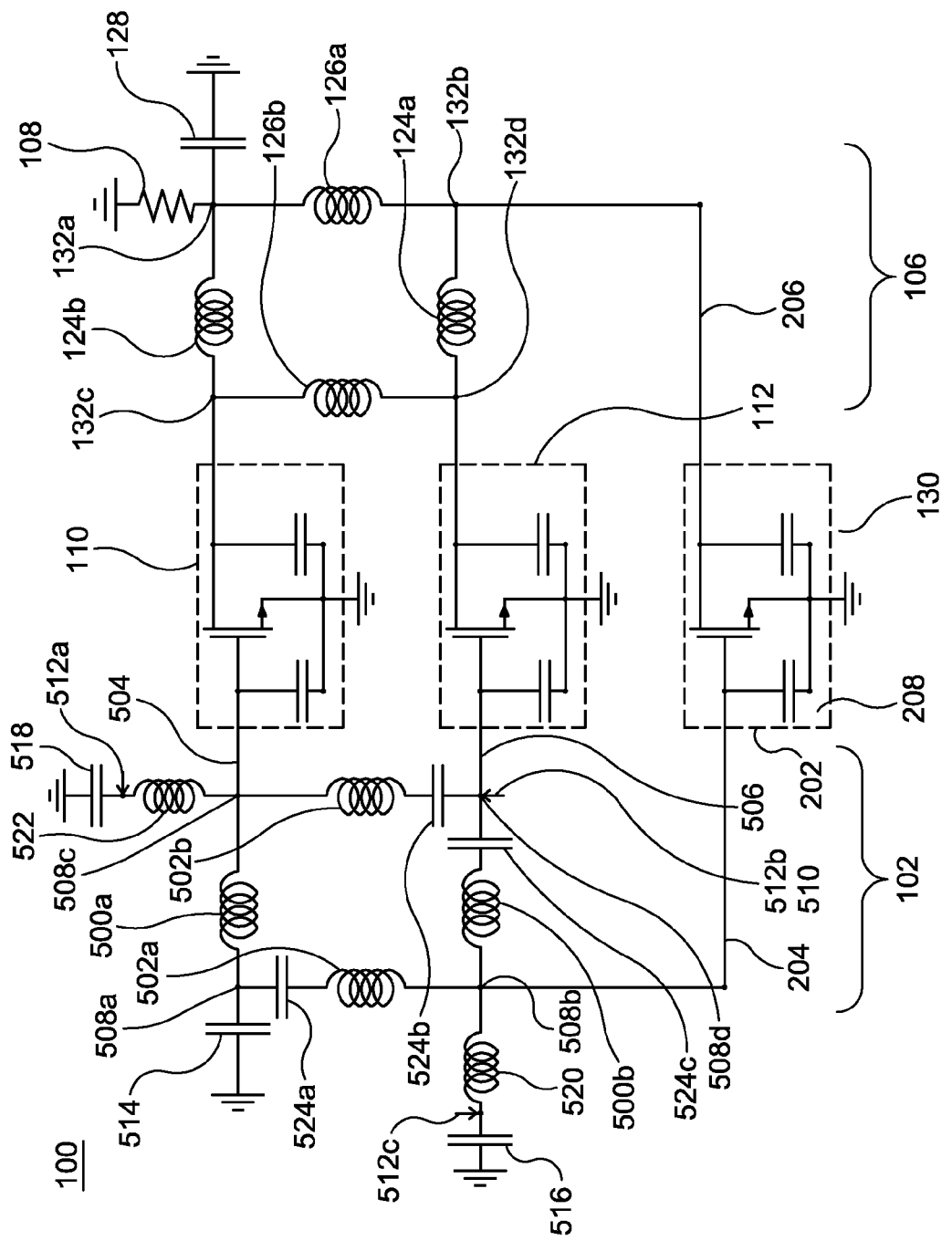
FIG. 5 is a schematic drawing of an ultra wideband Doherty amplifier including the line termination component of FIG. 2B and the input circuitry.

FIG. 5 shows a further schematic of a Doherty amplifier 100 comprising a second peak amplifier 202. Where components of the Doherty amplifier 100 of FIG. 5 are the same as FIG. 1 or 2, like reference numerals are used.

FIG. 5 shows the relative arrangements of the components of the Doherty amplifier 100 as they are arranged on chip. FIG. 5 also shows the input circuitry 102 in greater detail.

The input circuitry 102 is arranged in a similar fashion to the output circuitry 106. A first input inductor 500a is arranged on the input line 504 of the main amplifier 110 and a second input inductor 500b is arranged on the input line 506 of the first peak amplifier 112. In one example, first and second input inductors 500 have the same inductance but in other examples, they may be different.

A third input inductor 502a and a fourth input inductor 502b branch between the input line 504 of the main amplifier 110 and the input line 506 of the peak amplifier 112.

The third input inductor 502a branches from the input line 504 of the main amplifier 110 at first branch point 508a, located at the input of the first input inductor 500a, and branches from the input line 506 of the first peak amplifier 112 at a second branch point 508b, located at the input of the second input inductor 500b.

The fourth input inductor 502a branches from the input line 504 of the main amplifier 110 at third branch point 508c, located between the first input inductor 500a and the input of the main amplifier 110, and branches from the input line 506 of the first peak amplifier 112 at a fourth branch point 508d, located between the second input inductor 500b and the input of the first peak amplifier 112.

In one example, the third and fourth input inductors 502 have the same inductance as each other, different from the inductance of the first and second input inductors 500, although in other examples, they may be different. The input inductances are higher than the output inductances to ensure proper phase matching of the signals in the output circuitry 106.

Typically, the first and second input inductors 500 may have an inductance approximately four times higher than the third and fourth input inductances 502 and equivalent to the inductance of the first and second inductors 124 in the output circuitry 106. In order to achieve equivalent input and output inductances, the higher value input capacitors are partially resonated to the desired level thanks to the shunt inductors 520 and 522 terminated to ground through the decoupling capacitors 516 and 518. As with the inductors 124, 126 in the output circuitry and the capacitors 116, 118 used to couple the parasitic capacitances, the input inductors are varied to vary the operational range of the amplifier.

As with the output circuitry 102, the arrangement described above means the input circuitry behaves as a branch line coupler, this time acting to split an input signal.

The input signal 510 is provided at the fourth branch point 508d. The gate voltage 512b for the first peak amplifier is also provided at this point. The input line 504 of the main amplifier 110 is terminated by a grounded capacitor 514. The input line of the first peak amplifier 112 is also terminated by a grounded capacitor 516.

Where the block 130 comprises only the grounded capacitor 200, as shown in FIG. 2A, the input at the second branch point 508b will also be terminated by a grounded capacitor (not shown).

The gate voltage 512c of the second peak amplifier 202 is provided on the RF cold point (a point where no RF signal flows) created by the network formed by the inductor 520 and the grounded capacitor 516. Similarly, the gate voltage 512a of the main amplifier 110 is provided on the RF cold point created by the network formed by the inductor 522 and the grounded capacitor 518. The RF input signal and the gate voltage of the first peak amplifier 112 are provided on the input line 506 of the first peak amplifier 112, between the grounded capacitor 516 and branch point 508b.

The gate voltages 512 are DC signals, whilst the input signal is an AC signals. Blocking capacitors 524 are used to ensure that the gate voltages 512 do not interfere with one another. In other words, the gate voltage 512a of the main amplifier only reaches the main FET 114a, the gate voltage 512b of the first peak amplifier only reaches the first peak amplifier FET 114b and the gate voltage 512c of the second peak amplifier only reaches the second peak amplifier FET 114c.

First blocking capacitor 524a is provided between the first input inductor 500a and the third input inductor 502a, second blocking capacitor 524b is provided between the fourth input inductor and the fourth branch point 508d and third blocking capacitor 524c is provided between the fourth branch 508d and the second input inductor 500b.

The blocking capacitors 524 block the DC voltage signals but do not interfere with the AC RF input signal. It will be appreciated that instead of blocking capacitors 524, any suitable filtering element that allows the RF input signal to pass and blocks the DC voltage signals may be used.

Figure 6:
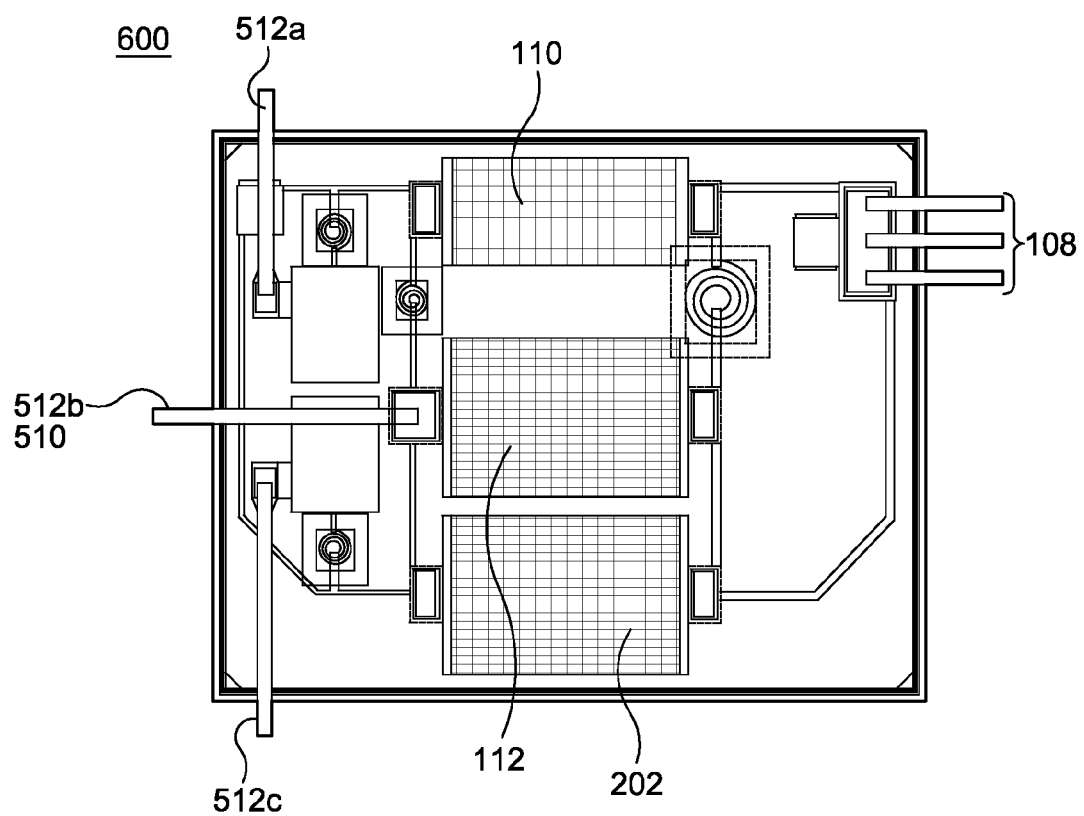
FIG. 6 shows a die layout for an integrated chip incorporating a Doherty amplifier including the line termination component of FIG. 2B.

FIG. 6 shows a die 600 of an integrated circuit comprising the Doherty amplifier 100 including a second peak amplifier 202. Once again, like reference symbols have been used where appropriate.

The ultra wideband Doherty amplifier 100 includes four inductors 124, 126 arranged in a square configuration on the output side and four inductors 500, 502 arranged in a square configuration on the input side. This makes it difficult for bond wires to be used. To overcome this, the die 600 is provided on GaN or a high resistivity substrate laterally diffused metal oxide semiconductor (HRS LDMOS), although other suitable technologies may be used. Transistors implemented on this technology may operate between 700 MHz to 3.5 GHz.

The die layout 600 has an area of approximately 2.5 mm by 2 mm. The die can then be provided in a conventional metal-ceramic package or an over-moulded package.

The main amplifier 110 develops 6 mm of gate periphery, while the peak amplifiers 112, 202 each develop 18 mm of gate periphery. This leads to a power capability of 25 W to 125 W depending on the chosen semiconductor technology. To increase the power capability, multiple Doherty amplifiers 100 can be provided in parallel. For example, two, three or more Doherty amplifiers 100 may be provided.

In the above description, two separate examples of circuitry have been presented in block 130. It will be appreciated that other examples of circuitry which act as a shunt capacitor to ground.

In the above description, it will appreciated that any reference to components being coupled or connected will refer to operative coupling, so as not to exclude the possibility of intervening components.

It will be further appreciated that although example values have been given for the inductors, capacitors and transistors, these are by way of example only and any value components may be used to achieve the same results.

The invention claimed is:

1. A Doherty amplifier for amplifying an input signal to an output signal, the Doherty amplifier comprising:
    a main amplifier for receiving a first signal and for amplifying the first signal to generate a first amplified signal, said main amplifier having an output line and an output capacitance connected to said output line;
    a first peak amplifier for receiving a second signal and for generating a second amplified signal, said first peak amplifier having an output line and an output capacitance connected to said output line, the first peak amplifier only operating when the second signal has reached a first threshold power, the first and second signal split from the input signal; and output circuitry to combine the first and second amplified signals to generate an output signal having an operating bandwidth, the output circuitry comprising inductors arranged in the format of a branch line coupler, wherein the output circuitry comprises:
  a first inductor having a first inductance connected on the output line of the first peak amplifier;
  a second inductor having the first inductance connected on the output line of the main amplifier,
  a third inductor having a second inductance branching between the outputs of the first inductor and second inductor;
  a fourth inductor having the second inductance branching between the inputs of the first and second inductors; and
  an output load having one terminal thereof connected between the second and third inductors.

2. A Doherty amplifier as claimed in claim 1, wherein a grounded capacitor is connected on the output line of the first peak amplifier.

3. A Doherty amplifier as claimed in claim 2, further comprising:
  back-off circuitry arranged to increase the operating back off at which the peak efficiency of the amplifier occurs.

4. A Doherty amplifier as claimed in claim 3, the back-off circuitry comprising:
  a second peak amplifier having an output capacitance, said second peak amplifier being configured for receiving a third signal split from the input signal and for generating a third amplified signal, the second peak amplifier only operating when the third signal has reached a second threshold power, the output capacitance of the second peak amplifier being coupled to the output circuitry, the output circuitry being arranged to combine the first, second and third amplified signals to generate the output signal.

5. A Doherty amplifier as claimed in claim 4, wherein the power of each peak amplifier is n times that of the main amplifier, such that ratio of the main amplifier to the Doherty amplifier is 1:2n+1.

6. A Doherty amplifier as claimed in claim 5, wherein n=3 and a peak the efficiency of the Doherty amplifier occurs at a back-off of between 8 dB and 9 dB.

7. A Doherty amplifier as claimed in claim 3, wherein the Doherty amplifier has at least one of or any combination of the following characteristics:
  a relative operating bandwidth of approximately 60%; and
  a power capability of between a few Watts and a few hundred Watts.

8. A Doherty amplifier as claimed in claim 1 comprising:
  input circuitry arranged to receive the input signal and split the input signal into the first signal and the second signal.

9. A Doherty amplifier as claimed in claim 8, wherein the main amplifier and the first peak amplifier each comprise a field effect transistor, both the main amplifier and the first peak amplifier having a respective input line and a respective input capacitance coupled to said respective input line, the input circuitry comprising:
  input inductors arranged in the format of a branch line coupler, the input inductors coupled to the input capacitances of the main amplifier and the first peak amplifier.

10. A Doherty amplifier as claimed in claim 9, the input circuitry comprising:
  a first input inductor having a first input inductance connected the input line of the main amplifier;
  a second input inductor having the first input inductance connected on the input line of the peak amplifier;
  a third input inductor having a second inductance branching between the inputs of the first and second input inductors;
  a fourth input inductor having the second inductance branching between the outputs of the first and second input inductors; and
  an input for the input signal between the second and fourth input inductors.

11. A Doherty amplifier as claimed in claim 4, comprising:
  input circuitry arranged to receive the input signal and split the input signal into the first signal and the second signal, wherein the main amplifier and the first peak amplifier each comprise a field effect transistor, both the main amplifier and the first peak amplifier having a respective input line and a respective input capacitance coupled to said respective input line, the input circuitry comprising input inductors arranged in the format of a branch line coupler, the input inductors coupled to the input capacitances of the main amplifier and the first peak amplifier;
  the second peak amplifier having an input capacitance, wherein the input circuitry is coupled to the input capacitance of the second peak amplifier and the second peak amplifier being connected between the second and third input inductors.

12. A cellular base station having a bandwidth between 0.7 GHz and 2.7 GHz, the cellular base station comprising:
  a Doherty amplifier as claimed in claim 1.

* * * * *